United States Patent
Knauer

(10) Patent No.: US 7,855,544 B1
(45) Date of Patent: Dec. 21, 2010

(54) AC LOW CURRENT PROBE CARD

(75) Inventor: William Knauer, Chagrin Falls, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 429 days.

(21) Appl. No.: 12/113,493

(22) Filed: May 1, 2008

(51) Int. Cl.
*G01R 31/02* (2006.01)
*G01R 1/06* (2006.01)
*G01R 31/20* (2006.01)

(52) U.S. Cl. ............... 324/72.5; 324/149; 324/754.07

(58) Field of Classification Search ............ 324/72.5, 324/149, 754.07
See application file for complete search history.

(56) References Cited

U.S. PATENT DOCUMENTS

| | | | | |
|---|---|---|---|---|
| 4,780,670 | A | * | 10/1988 | Cherry ............... 324/754 |
| 5,373,231 | A | | 12/1994 | Boll et al. |
| 5,594,358 | A | * | 1/1997 | Ishikawa et al. ........ 324/754 |
| 6,809,542 | B2 | * | 10/2004 | Dorman .............. 324/765 |
| 2006/0214677 | A1 | * | 9/2006 | Hayden et al. ......... 324/754 |
| 2008/0129279 | A1 | * | 6/2008 | Gallavan ............. 324/123 R |

\* cited by examiner

*Primary Examiner*—Timothy J Dole
(74) *Attorney, Agent, or Firm*—Pearne & Gordon LLP

(57) ABSTRACT

A probe system for connecting a measurement apparatus to a DUT includes an AC probe having an AC shield conductor and an AC probe conductor shielded by the AC shield; a first DC probe having a first DC probe conductor and a first guard conductor for guarding the first DC probe conductor when a virtual version of a voltage on the first DC probe conductor is applied to the first guard conductor; a second DC probe having a second DC probe conductor and a second guard conductor for guarding the second DC probe conductor when a virtual version of a voltage on the second DC probe conductor is applied to the second guard conductor; a first capacitive connection between the AC shield conductor and the first guard conductor; a second capacitive connection between the AC shield conductor and the second guard conductor; a third capacitive connection between the first guard conductor and the first DC probe conductor; and a fourth capacitive connection between the second guard conductor and the second DC probe conductor, each DC probe guard conductor having a virtual version of a DC voltage present on the respective DC probe conductor for DC measurements on the DUT by the measurement apparatus and the DC probe conductors providing an AC ground conductor for AC measurements on the DUT by the measurement apparatus.

3 Claims, 2 Drawing Sheets

AC LOW CURRENT PROBE CARD

BACKGROUND OF THE INVENTION

The present invention relates to the measurement of electrical parameters and, in particular, to a probe system for connecting to a device under test.

It is often necessary to make both DC and AC measurements on a device under test (DUT). Precision DC measurements often employ a signal conductor and "guard" conductor located in close proximity thereto. The electronics in the measurement apparatus impresses a virtual version of whatever voltage is on the signal conductor onto the guard conductor so there is no potential difference between the two, thus minimizing effects such as leakage capacitance that can limit low current measurements. AC measurements (e.g., RF, pulse or other signals containing signals having wavelengths comparable to conductor lengths) typically employ a signal conductor and a closely related ground conductor that helps provide the desired bandwidth for AC signals (e.g., coaxial cable or other transmission lines).

SUMMARY OF THE INVENTION

A probe system for connecting a measurement apparatus to a DUT includes an AC probe having an AC shield conductor and an AC probe conductor shielded by the AC shield; a first DC probe having a first DC probe conductor and a first guard conductor for guarding the first DC probe conductor when a virtual version of a voltage on the first DC probe conductor is applied to the first guard conductor; a second DC probe having a second DC probe conductor and a second guard conductor for guarding the second DC probe conductor when a virtual version of a voltage on the second DC probe conductor is applied to the second guard conductor; a first capacitive connection between the AC shield conductor and the first guard conductor; a second capacitive connection between the AC shield conductor and the second guard conductor; a third capacitive connection between the first guard conductor and the first DC probe conductor; and a fourth capacitive connection between the second guard conductor and the second DC probe conductor, each DC probe guard conductor having a virtual version of a DC voltage present on the respective DC probe conductor for DC measurements on the DUT by the measurement apparatus and the DC probe conductors providing an AC ground conductor for AC measurements on the DUT by the measurement apparatus.

DESCRIPTION OF THE PREFERRED EMBODIMENTS

Figure 1:
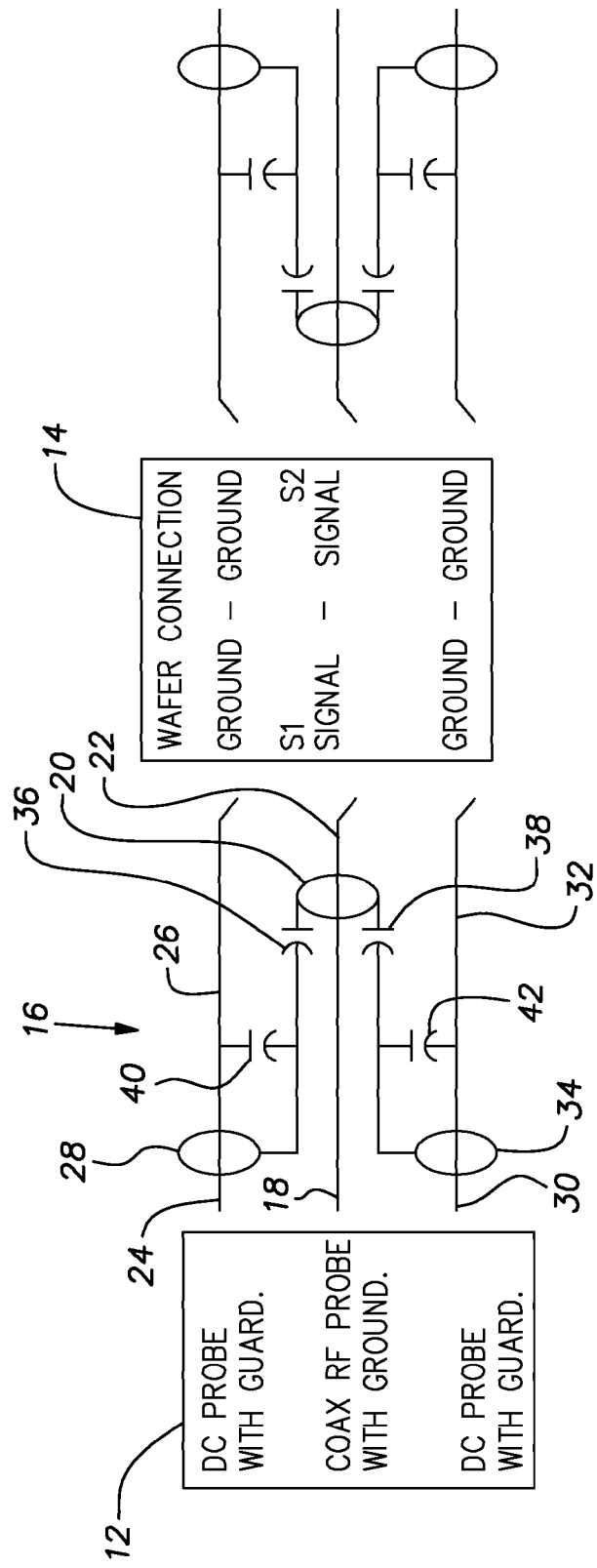
FIG. 1 is a block diagram of a measurement system that includes an example of a probe system according to the invention.

Referring to FIG. 1, a measurement apparatus 12 is connected to a DUT 14 with a probe system 16. The measurement apparatus 12 includes both AC and DC measurement capabilities.

The DC capabilities include the ability to provide a virtual version of DC output/input signals being sourced/measured. This is often produced by using a buffered version of the signals. Typical measurements are, for example, DC current, voltage and impedance.

The AC capabilities may include, for example, the generation of pulses, periodic waveforms and various modulation schemes and measurements may include, for example, amplitude, phase, frequency, impedance, demodulated values and actual waveforms.

The DUT 14 may be, for example, a semiconductor wafer containing circuits to be tested, individual integrated circuits, printed circuits or other devices where both AC and DC measurements are desired.

The probe system 16 includes an AC probe 18 having an AC shield conductor 20 and an AC probe conductor 22 shielded by the AC shield conductor 20; a first DC probe 24 having a first DC probe conductor 26 and a first guard conductor 28 for guarding the first DC probe conductor 26 when a virtual version of a voltage on the first DC probe conductor 26 is applied to the first guard conductor 28; a second DC probe 30 having a second DC probe conductor 32 and a second guard conductor 34 for guarding the second DC probe conductor 32 when a virtual version of a voltage on the second DC probe conductor 32 is applied to the second guard conductor 34; a first capacitive connection 36 between the AC shield conductor 20 and the first guard conductor 28; a second capacitive connection 38 between the AC shield conductor 20 and the second guard conductor 34; a third capacitive connection 40 between the first guard conductor 28 and the first DC probe conductor 26; and a fourth capacitive connection 42 between the second guard conductor 34 and the second DC probe conductor 32.

In operation, each DC probe guard conductor has a virtual version of a DC voltage present on the respective DC probe conductor for DC measurements on the DUT by the measurement apparatus and the DC probe conductors provide an AC ground conductor for AC measurements on the DUT by the measurement apparatus. The capacitive connections provide an AC connection between the DC probes and the AC shield when the DC probes are used as the AC ground connection for the AC probe.

Figure 2:
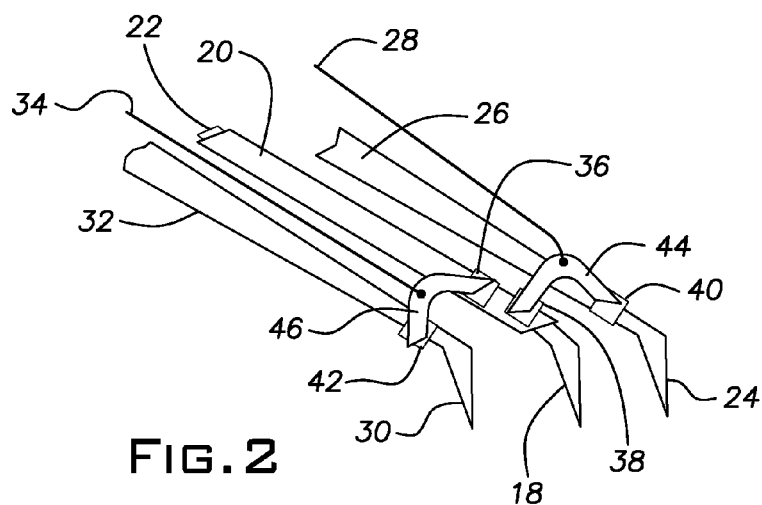
FIG. 2 is a schematic diagram of an example of probe needles configured according to the invention.

Referring to FIG. 2, the capacitive connections may be implemented, for example, by attaching chip capacitors 36, 38, 40, 42 to probe needles. The bottom of the capacitors are electrically bonded to the needles (e.g., soldered) and metal foil conductors 44, 46 connect the tops of the capacitors. DC guard conductors 28, 34 are also attached to the foil conductors 44, 46, respectively.

Typically, it is desirable for the tips of the probe needles to be independently flexible to facilitate good contact with the DUT. The foil conductors 44, 46 can be flexible enough to not interfere with the needles' flex.

In general, it is desirable to locate the capacitive connections as close to the probe tips as possible. However, it may be acceptable, for example, to move the connections back to the probe card that carries the probe needles.

Figure 3:
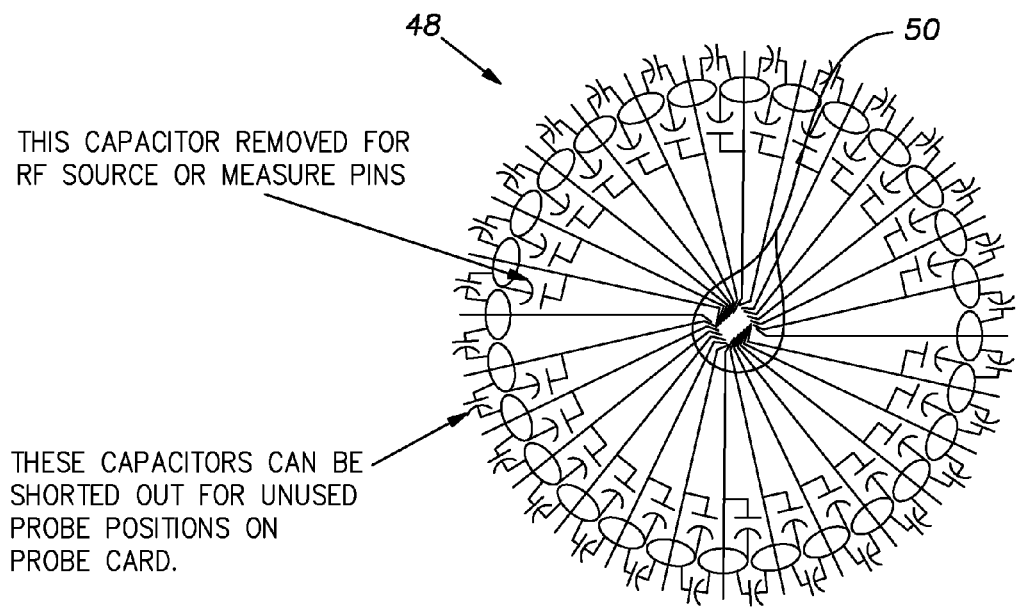
FIG. 3 is a schematic diagram of an example of a probe card configured according to the invention.

Referring to FIG. 3, a probe card 48 with needles 50 can have the capacitive connections on the card itself. Some performance may be sacrificed, but the structure is mechanically simpler.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A probe system for connecting a measurement apparatus to a DUT, said system comprising:
   an AC probe having an AC shield conductor and an AC probe conductor shielded by said AC shield conductor;
   a first DC probe having a first DC probe conductor and a first guard conductor for guarding said first DC probe conductor when a virtual version of a voltage on said first DC probe conductor is applied to said first guard conductor;
   a second DC probe having a second DC probe conductor and a second guard conductor for guarding said second DC probe conductor when a virtual version of a voltage on said second DC probe conductor is applied to said second guard conductor;
   a first capacitive connection between said AC shield conductor and said first guard conductor;
   a second capacitive connection between said AC shield conductor and said second guard conductor;
   a third capacitive connection between said first guard conductor and said first DC probe conductor; and
   a fourth capacitive connection between said second guard conductor and said second DC probe conductor, each DC probe guard conductor having a virtual version of a DC voltage present on the respective DC probe conductor for DC measurements on the DUT by the measurement apparatus and said DC probe conductors providing an AC ground conductor for AC measurements on the DUT by the measurement apparatus.

2. A system according to claim 1, wherein said capacitive connections are on probe needles.

3. A system according to claim 1, wherein said capacitive connections are on a probe card that carries probe needles.

* * * * *